US011239298B2

(12) United States Patent
Di et al.

(10) Patent No.: US 11,239,298 B2
(45) Date of Patent: Feb. 1, 2022

(54) OLED DISPLAY SUBSTRATE, METHOD OF FORMING THE SAME AND DISPLAY DEVICE

(71) Applicant: BOE TECHNOLOGY GROUP CO., LTD., Beijing (CN)

(72) Inventors: Muxin Di, Beijing (CN); Yingwei Liu, Beijing (CN); Zhiwei Liang, Beijing (CN); Haixu Li, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/641,560

(22) PCT Filed: Aug. 26, 2019

(86) PCT No.: PCT/CN2019/102529
§ 371 (c)(1),
(2) Date: Feb. 24, 2020

(87) PCT Pub. No.: WO2020/043051
PCT Pub. Date: Mar. 5, 2020

(65) Prior Publication Data
US 2021/0066425 A1 Mar. 4, 2021

(30) Foreign Application Priority Data
Aug. 31, 2018 (CN) .......................... 201811009989.7

(51) Int. Cl.
*G09G 3/3225* (2016.01)
*H01L 27/32* (2006.01)
*H01L 51/56* (2006.01)

(52) U.S. Cl.
CPC ....... *H01L 27/3269* (2013.01); *G09G 3/3225* (2013.01); *H01L 27/3272* (2013.01);
(Continued)

(58) Field of Classification Search
CPC .......... G09G 3/3225; G09G 2300/0809; H01L 27/3269; H01L 2227/323; H01L 27/3272
See application file for complete search history.

(56) References Cited

U.S. PATENT DOCUMENTS

2006/0030084 A1* 2/2006 Young ................. H01L 27/1214
438/149
2007/0285942 A1 12/2007 Yang et al.
(Continued)

FOREIGN PATENT DOCUMENTS

| CN | 101086999 A | 12/2007 |
|---|---|---|
| CN | 102402931 A | 4/2012 |
| CN | 109273493 A | 1/2019 |

OTHER PUBLICATIONS

Office Action of CN Application No. 201811009989.7 and English translation, dated Mar. 2, 2020, 18 pages.
(Continued)

*Primary Examiner* — Kevin M Nguyen
(74) *Attorney, Agent, or Firm* — Muncy, Geissler, Olds & Lowe, P.C.

(57) ABSTRACT

An Organic Light-emitting Diode (OLED) display substrate, a method of forming the same and a display device are provided. The OLED display substrate includes: a driving thin film transistor located on a base substrate and configured to drive an OLED light-emitting unit to emit light; and a photosensitive thin film transistor located on the base substrate and configured to be capable of detecting light emitted by the OLED light-emitting unit and generating an electrical signal, at least a part of film layers of the photosensitive thin film transistor and at least a part of film layers of the driving thin film transistor are disposed at a same layer and made of a same material.

18 Claims, 5 Drawing Sheets

(52) U.S. Cl.
CPC ..... *H01L 51/56* (2013.01); *G09G 2300/0809* (2013.01); *G09G 2360/145* (2013.01); *H01L 27/3262* (2013.01); *H01L 27/3265* (2013.01); *H01L 2227/323* (2013.01)

(56) References Cited

U.S. PATENT DOCUMENTS

| | | | |
|---|---|---|---|
| 2009/0315877 A1* | 12/2009 | Deane | G09G 3/3233 |
| | | | 345/214 |
| 2010/0001639 A1 | 1/2010 | Kim et al. | |
| 2010/0327753 A1 | 12/2010 | Ebisawa et al. | |
| 2012/0061556 A1 | 3/2012 | Chan et al. | |
| 2014/0008656 A1* | 1/2014 | Shim | H01L 29/66765 |
| | | | 257/59 |
| 2015/0348494 A1* | 12/2015 | Lim | G09G 3/3648 |
| | | | 345/211 |
| 2018/0102393 A1* | 4/2018 | Liu | H01L 31/1055 |

OTHER PUBLICATIONS

International Search Report of PCT/CN2019/102529 and English translation, dated Nov. 21, 2019, 15 pages.

\* cited by examiner

OLED DISPLAY SUBSTRATE, METHOD OF FORMING THE SAME AND DISPLAY DEVICE

CROSS-REFERENCE TO RELATED APPLICATIONS

This application is the U.S. national phase of PCT Application PCT/CN2019/102529 filed on Aug. 26, 2019, which claims a priority to Chinese Patent Application No. 201811009989.7 filed in China on Aug. 31, 2018, the disclosure of which are incorporated herein in its entirety by reference.

TECHNICAL FIELD

The present disclosure relates to the field of display technology, in particular to an OLED display substrate, a method of forming the same and a display device.

BACKGROUND

An Organic Light-emitting Diode (OLED) display product has gradually been matured after a long period of development, and gradually appears in a terminal product. A light-emitting principle of the OLED display device is: an electron and a hole are injected from a cathode and an anode respectively. When the electron and the hole meet near a certain molecule in an organic light-emitting layer, due to the coulomb effect, the electron and the hole will be bound together to form an exciton, and recombination occurs after the exciton diffuses and drifts in the organic light-emitting layer to an appropriate position. Since the exciton itself is in an excited state, energy is released when recombined, and a part released in a form of radiation is light-emitting.

SUMMARY

An Organic Light-emitting Diode (OLED) display substrate, a method of forming the same and a display device are provided in the present disclosure.

In a first aspect, an Organic Light-emitting Diode (OLED) display substrate is provided, including: a driving thin film transistor located on a base substrate and configured to drive an OLED light-emitting unit to emit light; and a photosensitive thin film transistor located on the base substrate and configured to be capable of detecting light emitted by the OLED light-emitting unit and generating an electrical signal, where at least a part of film layers of the photosensitive thin film transistor and at least a part of film layers of the driving thin film transistor are disposed at a same layer and made of a same material.

Optionally, a gate electrode of the photosensitive thin film transistor and a first light-shielding pattern of the driving thin film transistor are disposed at a same layer and made of a same material, and the first light-shielding pattern is located between an active layer of the driving thin film transistor and the base substrate; and/or an active layer of the photosensitive thin film transistor and the active layer of the driving thin film transistor are disposed at a same layer and made of a same material; and/or a source electrode and a drain electrode of the photosensitive thin film transistor and a gate electrode of the driving thin film transistor are disposed at a same layer and made of a same material.

Optionally, the OLED display substrate further includes: a second light-shielding pattern located at a side of an active layer of the driving thin film transistor away from the base substrate, where an orthographic projection of the active layer of the driving thin film transistor onto the base substrate is within an orthographic projection of the second light-shielding pattern onto the base substrate.

Optionally, the OLED display substrate further includes: a detection signal line configured to transmit the electric signal generated by the photosensitive thin film transistor to a driving circuit; and a switching thin film transistor configured to control a conduction connection between an output terminal of the photosensitive thin film transistor and the detection signal line, where at least a part of film layers of the switching thin film transistor and at least a part of film layers of the driving thin film transistor are disposed at a same layer and made of a same material.

Optionally, a third light-shielding pattern of the switching thin film transistor and a first light-shielding pattern of the driving thin film transistor are disposed at a same layer and made of a same material, the first light-shielding pattern is located between an active layer of the driving thin film transistor and the base substrate, and the third light-shielding pattern is located between an active layer of the switching thin film transistor and the base substrate; and/or the active layer of the switching thin film transistor and the active layer of the driving thin film transistor are disposed at a same layer and made of a same material; and/or a source electrode and a drain electrode of the switching thin film transistor and a source electrode and a drain electrode of the driving thin film transistor are disposed at a same layer and made of a same material.

Optionally, the OLED display substrate further includes: a fourth light-shielding pattern located at a side of the active layer of the switching thin film transistor away from the base substrate, where an orthographic projection of the active layer of the switching thin film transistor onto the base substrate is within an orthographic projection of the fourth light-shielding pattern onto the base substrate.

Optionally, a drain electrode of the switching thin film transistor is connected to the detection signal line, and a source electrode of the switching thin film transistor is connected to the output terminal of the photosensitive thin film transistor, or the drain electrode of the switching thin film transistor is connected to the detection signal line, and a storage capacitor is formed between the source electrode of the switching thin film transistor and the output terminal of the photosensitive thin film transistor; and the output terminal of the photosensitive thin film transistor is a source electrode or a drain electrode of the photosensitive thin film transistor.

Optionally, a gate electrode of the photosensitive thin film transistor is connected to a source electrode of the photosensitive thin film transistor; or the gate electrode of the photosensitive thin film transistor is connected to a gate electrode on-state voltage input terminal, and the gate electrode on-state voltage input terminal is configured to input a gate electrode on-state voltage.

Optionally, the photosensitive thin film transistor, the driving thin film transistor and the switching thin film transistor are located between the OLED light-emitting unit and the base substrate.

Optionally, the fourth light-shielding pattern is connected to a gate electrode of the switching thin film transistor through a via-hole.

In a second aspect, a display device is provided in the present disclosure, including: the OLED display substrate described in the first aspect above.

Optionally, the display device further includes: a driving circuit configured to receive the electrical signal generated by the photosensitive thin film transistor through a detection signal line, and perform optical compensation on the OLED light-emitting unit in response to the received electrical signal.

In a third aspect, a method of forming an organic light-emitting diode (OLED) display substrate is provided in the present disclosure, including: forming at least one or all of film layers of a photosensitive thin film transistor and at least one or all of film layers of a driving thin film transistor on a base substrate in a same patterning process simultaneously, where the photosensitive thin film transistor is capable of detecting light emitted by an OLED light-emitting unit and generating an electrical signal, and the driving thin film transistor is configured to drive the OLED light-emitting unit to emit light.

Optionally, the forming at least a part or all of the film layers of the photosensitive thin film transistor and at least a part or all of the film layers of the driving thin film transistor on the base substrate in the same patterning process includes: forming a gate electrode of the photosensitive thin film transistor and a first light-shielding pattern of the driving thin film transistor simultaneously in one patterning process, where the first light-shielding pattern is located between an active layer of the driving thin film transistor and the base substrate; and/or forming an active layer of the photosensitive thin film transistor and the active layer of the driving thin film transistor simultaneously in one patterning process; and/or forming a source electrode of the photosensitive thin film transistor, a drain electrode of the photosensitive thin film transistor and a gate electrode of the driving thin film transistor simultaneously in one patterning process.

Optionally, the method of forming the OLED display substrate further includes: forming a second light-shielding pattern located at a side of an active layer of the driving thin film transistor away from the base substrate, where an orthographic projection of the active layer of the driving thin film transistor onto the base substrate is within an orthographic projection of the second light-shielding pattern onto the base substrate.

Optionally, the method of forming the OLED display substrate further includes: forming a detection signal line configured to transmit the electric signal generated by the photosensitive thin film transistor to a driving circuit; and forming a switching thin film transistor configured to control a conduction connection between an output terminal of the photosensitive thin film transistor and the detection signal line, where at least a part of film layers of the switching thin film transistor and at least a part of film layers of the driving thin film transistor are formed in a same patterning process.

Optionally, the forming the switching thin film transistor includes: forming a third light-shielding pattern of the switching thin film transistor and a first light-shielding pattern of the driving thin film transistor simultaneously in one patterning process, where the first light-shielding pattern is located between an active layer of the driving thin-film transistor and the base substrate, the third light-shielding pattern is located between an active layer of the switching thin film transistor and the base substrate; and/or forming the active layer of the switching thin film transistor and the active layer of the driving thin film transistor simultaneously in one patterning process, and/or forming a source electrode and a drain electrode of the switching thin film transistor and a source electrode and a drain electrode of the driving thin film transistor simultaneously in one patterning process.

Optionally, the method of forming the OLED display substrate further includes: forming a fourth light-shielding pattern located at a side of an active layer of the switching thin film transistor away from the base substrate, where an orthographic projection of the active layer of the switching thin film transistor onto the base substrate is within an orthographic projection of the fourth light-shielding pattern onto the base substrate.

Optionally, the method of forming the OLED display substrate further includes: forming the OLED light-emitting unit on the base substrate on which the photosensitive thin film transistor, the driving thin film transistor and a switching thin film transistor are formed.

Optionally, subsequent to the forming the source electrode and the drain electrode of the photosensitive thin film transistor, the method further includes: connecting the gate electrode of the photosensitive thin film transistor to the source electrode of the photosensitive thin film transistor; or subsequent to the forming the gate electrode of the photosensitive thin film transistor, the method further includes: connecting the gate electrode of the photosensitive thin film transistor to a gate electrode on-state voltage input terminal.

DETAILED DESCRIPTION

Figure 1A:
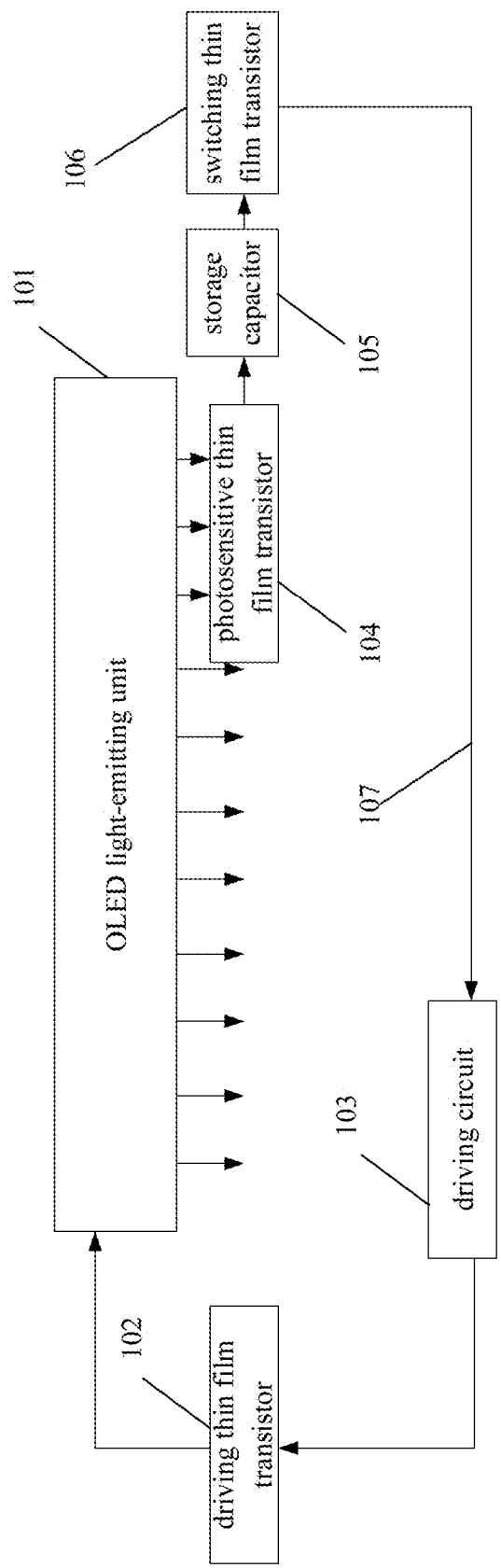
FIG. 1A is a first operation schematic view of an OLED display substrate in some embodiments of the present disclosure.

In order to make the technical problem to be solved, the technical solution and advantages of the embodiments of the present disclosure clearer, a detailed description will be given below with reference to the accompanying drawings and specific embodiments.

Due to limitation of an Organic Light-emitting Diode (OLED) process, anode resistance and thicknesses of light-emitting layers of different pixels of OLED display devices are different, which causes the brightness of the light-emitting layer to be uneven, then the development of OLED display technology is limited. With increasing demand for large-sized OLED displays in market, how to make the OLED light emission to be uniform has become particularly obvious.

The light emission brightness compensation method in the related OLED display products is an optical compensation method. A forming process of such OLED display products is relatively complicated.

In view of the above issues, an OLED display substrate, a method of forming the same and a display device are provided in some embodiments of the present disclosure, which can simplify the complexity of the OLED display substrate process and reduce the production cost of the OLED display substrate.

An OLED display substrate is provided in some embodiments of the present disclosure, including: an OLED light-emitting unit located on a base substrate; a driving thin film transistor configured to drive the OLED light-emitting unit to emit light; and a photosensitive thin film transistor located between the base substrate and the OLED light-emitting unit and configured to be capable of detecting light emitted by the OLED light-emitting unit and generating an electrical signal, where at least a part of film layers of the photosensitive thin film transistor and at least a part of film layers of the driving thin film transistor are disposed at a same layer and made of a same material.

According to some embodiments of the present disclosure, the photosensitive thin film transistor is used to detect the light emitted by the OLED light-emitting unit and generate the electrical signal, and then optical compensation for the OLED light-emitting unit is achieved. At least a part of the film layers of the photosensitive thin film transistor and at least a part of the film layers of the driving thin film transistor are disposed at a same layer and made of a same material, and all the film layers of the photosensitive thin film transistor and at least a part of the film layer of the driving thin film transistor may be formed in the same patterning process, thereby reducing the number of patterning processes of the OLED display substrate, simplifying the complexity of the OLED display substrate forming process, and reducing the production cost of OLED display substrates.

Specifically, a gate electrode of the photosensitive thin film transistor may be connected to a source electrode of the photosensitive thin film transistor. In the case that the OLED light-emitting unit emits light, the photosensitive thin film transistor generates the electrical signal after receiving the light. The electrical signal enables that the gate electrode of the photosensitive thin film transistor is turned on. The generated electrical signal flows via the source electrode of the photosensitive thin film transistor to the drain electrode of the photosensitive thin film transistor, and then the electrical signal may be fed back to a driving circuit of an OLED display product to realize corresponding optical compensation. Or, the gate electrode of the photosensitive thin film transistor is continuously input with a gate electrode on-state voltage, and the photosensitive thin film transistor is continuously turned on. In the case that there is no light irradiated to the photosensitive thin film transistor, a leakage current of the photosensitive thin film transistor is a first value, in the case that there is light irradiated to the photosensitive thin film transistor, the leakage current of the photosensitive thin film transistor becomes a second value. And the first value and the second value are fed back to the driving circuit of the OLED display product, and the corresponding optical compensation may be realized.

In a specific embodiment, the gate electrode of the photosensitive thin film transistor and a first light-shielding pattern of the driving thin film transistor are disposed at a same layer and made of a same material, and the first light-shielding pattern is located between an active layer of the driving thin film transistor and the base substrate, in order to avoid the influence of external light on the performance of the driving thin film transistor, the first light-shielding pattern is provided between the active layer of the driving thin film transistor and the base substrate; and/or an active layer of the photosensitive thin film transistor and the active layer of the driving thin film transistor are disposed at a same layer and made of a same material; and/or a source electrode and a drain electrode of the photosensitive thin film transistor and a gate electrode of the driving thin film transistor are disposed at a same layer and made of a same material.

Optionally, the gate electrode of the photosensitive thin film transistor and the first light-shielding pattern of the driving thin film transistor are disposed at a same layer and made of a same material, the active layer of the photosensitive thin film transistor and the active layer of the driving thin film transistor are disposed at a same layer and made of a same material, and the source electrode and the drain electrode of the photosensitive thin film transistor and the gate electrode of the driving thin film transistor are disposed at a same layer and made of a same material. Thus, the photosensitive thin film transistor may be manufactured in the process of forming the driving thin film transistor, and the photosensitive thin film transistor does not need to be manufactured in an additional patterning process.

Optionally, the OLED display substrate further includes: a second light-shielding pattern located at a side of the active layer of the driving thin film transistor away from the base substrate, an orthographic projection of the active layer of the driving thin film transistor onto the base substrate is within an orthographic projection of the second light-shielding pattern onto the base substrate.

In order to detect the light emitted by the OLED light-emitting unit, the active layer of the photosensitive thin film transistor is made of a photosensitive material. In the case that the active layer of the driving thin film transistor and the active layer of the photosensitive thin film transistor are disposed at a same layer and made of a same material, the active layer of the driving thin film transistor is also made of the photosensitive material. In order to prevent the light emitted by the OLED light-emitting unit from being irradiated onto the active layer of the driving thin film transistor, which affects the performance of the driving thin film transistor, the second light-shielding pattern is provided at a side of the active layer of the driving thin film transistor away from the base substrate.

Optionally, the OLED display substrate further includes: a detection signal line configured to transmit the electric signal generated by the photosensitive thin film transistor to a driving circuit; and a switching thin film transistor configured to control a conduction connection between an output terminal of the photosensitive thin film transistor and the detection signal line, at least a part of film layers of the switching thin film transistor and at least a part of film layers of the driving thin film transistor are disposed at a same layer and made of a same material.

According to some embodiments of the present disclosure, the OLED display substrate further includes the switching thin film transistor, the conduction connection between the output terminal of the photosensitive thin film transistor and the detection signal line may be controlled by the switching thin film transistor, such that in the case that the optical compensation is needed, the electrical signal output by the photosensitive thin film transistor may be received; in the case that the optical compensation is not needed, the electrical signal output by the photosensitive thin film transistor is not received. At least a part of the film layers of the switching thin film transistor and at least a part of the film layers of the driving thin film transistor are disposed at a same layer and made of a same material, such that at least a part of the film layers of the switching thin film transistor and at least a part of the film layers of the driving thin film transistor may be formed in the same patterning process, thereby reducing the number of patterning processes of the OLED display substrate, simplifying the complexity of the OLED display substrate forming process, and reducing the production cost of OLED display substrates.

Optionally, a third light-shielding pattern of the switching thin film transistor and a first light-shielding pattern of the driving thin film transistor are disposed at a same layer and made of a same material, the first light-shielding pattern is located between an active layer of the driving thin film transistor and the base substrate, and the third light-shielding pattern is located between an active layer of the switching thin film transistor and the base substrate; and/or the active layer of the switching thin film transistor and the active layer of the driving thin film transistor are disposed at a same layer and made of a same material; and/or a source electrode and a drain electrode of the switching thin film transistor and a source electrode and a drain electrode of the driving thin film transistor are disposed at a same layer and made of a same material.

Optionally, a third light-shielding pattern of the switching thin film transistor and a first light-shielding pattern of the driving thin film transistor are disposed at a same layer and made of a same material, the active layer of the switching thin film transistor and the active layer of the driving thin film transistor are disposed at a same layer and made of a same material; and a source electrode and a drain electrode of the switching thin film transistor and a source electrode and a drain electrode of the driving thin film transistor are disposed at a same layer and made of a same material. Thus, most of the film layers of the switching thin film transistor may be completed in the process of forming the driving thin film transistor.

Optionally, the OLED display substrate further includes: a fourth light-shielding pattern located at a side of the active layer of the switching thin film transistor away from the base substrate, an orthographic projection of the active layer of the switching thin film transistor onto the base substrate is within an orthographic projection of the fourth light-shielding pattern onto the base substrate.

Optionally, the fourth light-shielding pattern is connected to the gate electrode of the switching thin film transistor through a via-hole.

In order to detect the light emitted by the OLED light-emitting unit, the active layer of the photosensitive thin film transistor is made of a photosensitive material. In the case that the active layer of the switching thin film transistor and the active layer of the driving thin film transistor are disposed at a same layer and made of a same material, and then the active layer of the switching thin film transistor and the active layer of the photosensitive thin film transistor are disposed at a same layer and made of a same material, the active layer of the switching thin film transistor is also made of the photosensitive material. In order to prevent the light emitted by the OLED light-emitting unit and external light from being irradiated onto the active layer of the switching thin film transistor, which affects the performance of the switching thin film transistor, the fourth light-shielding pattern is provided at a side of the active layer of the switching thin film transistor away from the base substrate, and the third light-shielding pattern is provided between the active layer of the switching thin film transistor and the base substrate.

Optionally, the drain electrode of the switching thin film transistor is connected to the detection signal line, and the source electrode of the switching thin film transistor is connected to the output terminal of the photosensitive thin film transistor, or the drain electrode of the switching thin film transistor is connected to the detection signal line, and a storage capacitor is formed between the source electrode of the switching thin film transistor and the output terminal of the photosensitive thin film transistor; and the output terminal of the photosensitive thin film transistor is the source electrode or the drain electrode of the photosensitive thin film transistor. In order to avoid instability of the electrical signal output by the photosensitive thin film transistor and affect a result of the optical compensation, the storage capacitor may be provided between the switching thin film transistor and the photosensitive thin film transistor, and the electrical signal output by the photosensitive thin film transistor may be stabilized by the storage capacitor, and in order to simplify a structure of the OLED display substrate, the two electrodes of the storage capacitor may be the source electrode of the switching thin film transistor and the output terminal of the photosensitive thin film transistor.

A display device is further provided in some embodiment of the present disclosure, including the OLED display substrate as described above. The display device may be any product or component having a display function, such as a television, a monitor, a digital photo frame, a mobile phone, and a tablet computer. The display device further includes a flexible circuit board, a printed circuit board and a back plate.

Optionally, the display device further includes: a driving circuit configured to receive, through a detection signal line, the electrical signal generated by the photosensitive thin film transistor, and perform optical compensation on the OLED light-emitting unit in response to the received electrical signal.

The driving circuit of the OLED display product may, or may not include the driving thin film transistor.

A method of forming an organic light-emitting diode (OLED) display substrate is further provided in some embodiment of the present disclosure, including: forming at least a part or all of film layers of a photosensitive thin film transistor and at least a part or all of film layers of a driving thin film transistor on a base substrate in a same patterning process simultaneously, where the photosensitive thin film transistor is capable of detecting light emitted by an OLED light-emitting unit and generating an electrical signal, and the driving thin film transistor is configured to drive the OLED light-emitting unit to emit light.

Optionally, the method of forming the OLED display substrate further includes: forming the OLED light-emitting unit on the base substrate on which the photosensitive thin film transistor and the driving thin film transistor are formed.

According to some embodiments of the present disclosure, the photosensitive thin film transistor is used to detect the light emitted by the OLED light-emitting unit and generate the electrical signal, and then optical compensation for the OLED light-emitting unit is achieved. At least a part of the film layers of the photosensitive thin film transistor and at least a part of the film layers of the driving thin film transistor may be formed in the same patterning process, thereby reducing the number of patterning processes of the OLED display substrate, simplifying the complexity of the OLED display substrate forming process, and reducing the production cost of OLED display substrates.

Optionally, the forming at least one or all of the film layers of the photosensitive thin film transistor and at least one or all of the film layers of the driving thin film transistor on the base substrate in the same patterning process includes specifically: forming a gate electrode of the photosensitive thin film transistor and a first light-shielding pattern of the driving thin film transistor simultaneously in one patterning process, where the first light-shielding pattern is located between an active layer of the driving thin film transistor and the base substrate; and/or forming an active layer of the photosensitive thin film transistor and the active layer of the driving thin film transistor simultaneously in one patterning process; and/or forming a source electrode of the photosensitive thin film transistor, a drain electrode of the photosensitive thin film transistor and a gate electrode of the driving thin film transistor simultaneously in one patterning process.

Optionally, forming the gate electrode of the photosensitive thin film transistor and the first light-shielding pattern of the driving thin film transistor simultaneously in one patterning process, forming the active layer of the photosensitive thin film transistor and the active layer of the driving thin film transistor simultaneously in one patterning process; and forming the source electrode of the photosensitive thin film transistor, the drain electrode of the photosensitive thin film transistor and the gate electrode of the driving thin film transistor simultaneously in one patterning process. Thus, the photosensitive thin film transistor may be manufactured in the process of forming the driving thin film transistor, and the photosensitive thin film transistor does not need to be manufactured in an additional patterning process.

Optionally, prior to the forming the OLED light-emitting unit, the method of forming the OLED display substrate further includes: forming a second light-shielding pattern located at a side of the active layer of the driving thin film transistor away from the base substrate, where an orthographic projection of the active layer of the driving thin film transistor onto the base substrate is within an orthographic projection of the second light-shielding pattern onto the base substrate.

In order to detect the light emitted by the OLED light-emitting unit, the active layer of the photosensitive thin film transistor is made of a photosensitive material. In the case that the active layer of the driving thin film transistor and the active layer of the photosensitive thin film transistor are disposed at a same layer and made of a same material, the active layer of the driving thin film transistor is also made of the photosensitive material. In order to prevent the light emitted by the OLED light-emitting unit from being irradiated onto the active layer of the driving thin film transistor, which affects the performance of the driving thin film transistor, the second light-shielding pattern is provided at a side of the active layer of the driving thin film transistor away from the base substrate.

Optionally, the method of forming the OLED display substrate further includes: forming a detection signal line configured to transmit the electric signal generated by the photosensitive thin film transistor to a driving circuit; and forming a switching thin film transistor configured to control a conduction connection between an output terminal of the photosensitive thin film transistor and the detection signal line, where at least a part of film layers of the switching thin film transistor and at least a part of film layers of the driving thin film transistor are formed in a same patterning process.

In some embodiments of the present disclosure, the OLED display substrate further includes the switching thin film transistor, the conduction connection between the output terminal of the photosensitive thin film transistor and the detection signal line may be controlled by the switching thin film transistor, such that in the case that the optical compensation is needed, the electrical signal output by the photosensitive thin film transistor may be received; in the case that the optical compensation is not needed, the electrical signal output by the photosensitive thin film transistor is not received. At least a part of the film layers of the switching thin film transistor and at least a part of the film layers of the driving thin film transistor may be formed in the same patterning process, thereby reducing the number of patterning processes of the OLED display substrate, simplifying the complexity of the OLED display substrate forming process, and reducing the production cost of OLED display substrates.

Optionally, the forming the switching thin film transistor includes specifically: forming a third light-shielding pattern of the switching thin film transistor and a first light-shielding pattern of the driving thin film transistor simultaneously in one patterning process, where the first light-shielding pattern is located between the active layer of the driving thin-film transistor and the base substrate, the third light-shielding pattern is located between the active layer of the switching thin film transistor and the base substrate; and/or forming the active layer of the switching thin film transistor and the active layer of the driving thin film transistor simultaneously in one patterning process, and/or forming a source electrode and a drain electrode of the switching thin film transistor and a source electrode and a drain electrode of the driving thin film transistor simultaneously in one patterning process.

Optionally, forming the third light-shielding pattern of the switching thin film transistor and the first light-shielding pattern of the driving thin film transistor simultaneously in one patterning process, forming the active layer of the switching thin film transistor and the active layer of the driving thin film transistor simultaneously in one patterning process, and forming the source electrode and the drain electrode of the switching thin film transistor and the source electrode and the drain electrode of the driving thin film transistor simultaneously in one patterning process. Thus, most of the film layers of the switching thin film transistor may be completed in the process of forming the driving thin film transistor.

Optionally, the method of forming the OLED display substrate further includes: forming a fourth light-shielding pattern located at a side of the active layer of the switching thin film transistor away from the base substrate, where an orthographic projection of the active layer of the switching thin film transistor onto the base substrate is within an orthographic projection of the fourth light-shielding pattern onto the base substrate.

In order to detect the light emitted by the OLED light-emitting unit, the active layer of the photosensitive thin film transistor is made of a photosensitive material. In the case that the active layer of the switching thin film transistor and the active layer of the driving thin film transistor are disposed at a same layer and made of a same material, and then the active layer of the switching thin film transistor and the active layer of the photosensitive thin film transistor are disposed at a same layer and made of a same material, the active layer of the switching thin film transistor is also made of the photosensitive material. In order to prevent the light emitted by the OLED light-emitting unit and external light from being irradiated onto the active layer of the switching thin film transistor, which affects the performance of the switching thin film transistor, the fourth light-shielding pattern is provided at a side of the active layer of the switching thin film transistor away from the base substrate, and the third light-shielding pattern is provided between the active layer of the switching thin film transistor and the base substrate.

Optionally, the method of forming the OLED display substrate further includes: forming the OLED light-emitting unit on the base substrate on which the photosensitive thin film transistor, the driving thin film transistor and the switching thin film transistor are formed.

Optionally, subsequent to the forming the source electrode and the drain electrode of the photosensitive thin film transistor, the method further includes: connecting the gate electrode of the photosensitive thin film transistor to the source electrode of the photosensitive thin film transistor; or subsequent to the forming the gate electrode of the photosensitive thin film transistor, the method further includes: connecting the gate electrode of the photosensitive thin film transistor to a gate electrode on-state voltage input terminal.

In the following, an OLED display substrate provided with a driving thin film transistor, a photosensitive thin film transistor, a switching thin film transistor, and a storage capacitor is taken as an example to further introduce the OLED display substrate of the present disclosure. FIG. 1A is a first operation schematic view of an OLED display substrate in some embodiments of the present disclosure. As shown in FIG. 1A, light emitted by an OLED light-emitting unit 101 is irradiated onto an active layer of a photosensitive thin film transistor 104. The photosensitive thin film transistor 104 receives the light, generates current, and charges a storage capacitor 105. Different currents are generated due to different intensities of light. Generally, the stronger the intensity of the light received by the photosensitive thin film transistor 104 is, the larger the current generated is. The current is then lead out by a switching thin film transistor 106, input to a driving circuit 103, and the driving circuit 103 controls a driving thin film transistor 102 to adjust the light emission of the OLED light-emitting unit 101 in response to the magnitude of the current, and the compensation of the OLED light-emitting unit 101 light emission is completed. The switching thin film transistor 106 is connected to the driving circuit 103 via a detection signal line 107.

Figure 1B:
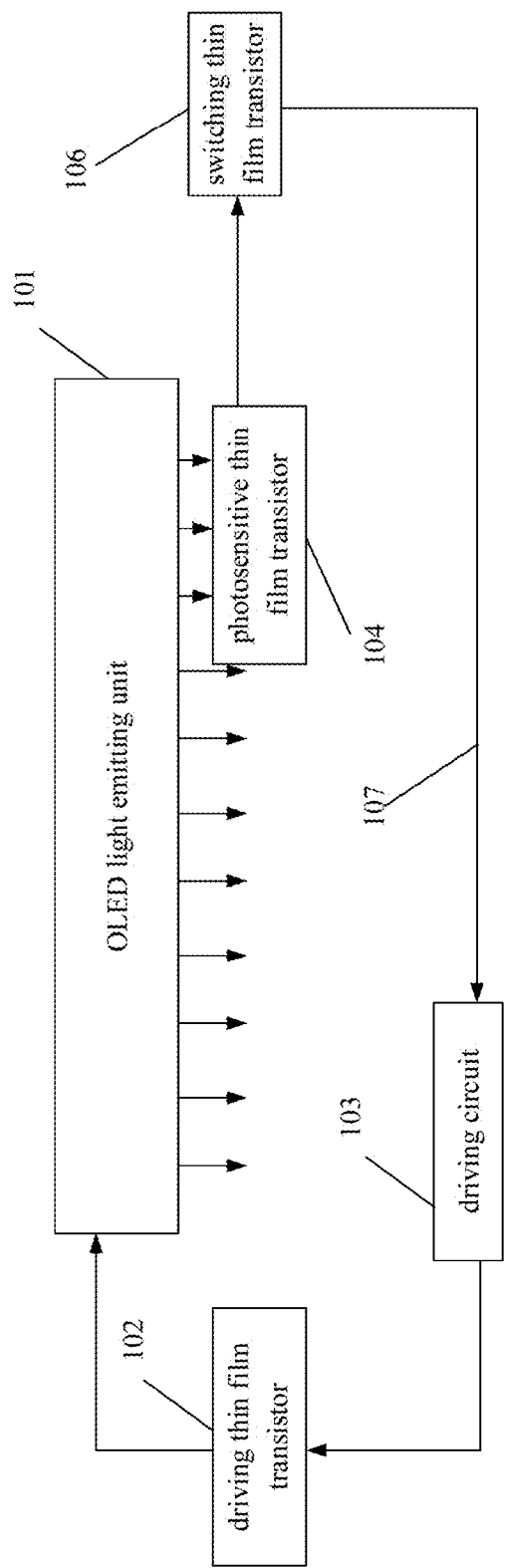
FIG. 1B is a second operation schematic view of an OLED display substrate in some embodiments of the present disclosure.

FIG. 1B is a second operation schematic view of an OLED display substrate in some embodiments of the present disclosure. FIG. 1B differs from FIG. 1A in that the current generated by the photosensitive thin film transistor 104 is directly lead out via the switching thin film transistor 106 and input to the driving circuit 103 without the storage capacitor being provided.

Figure 2:
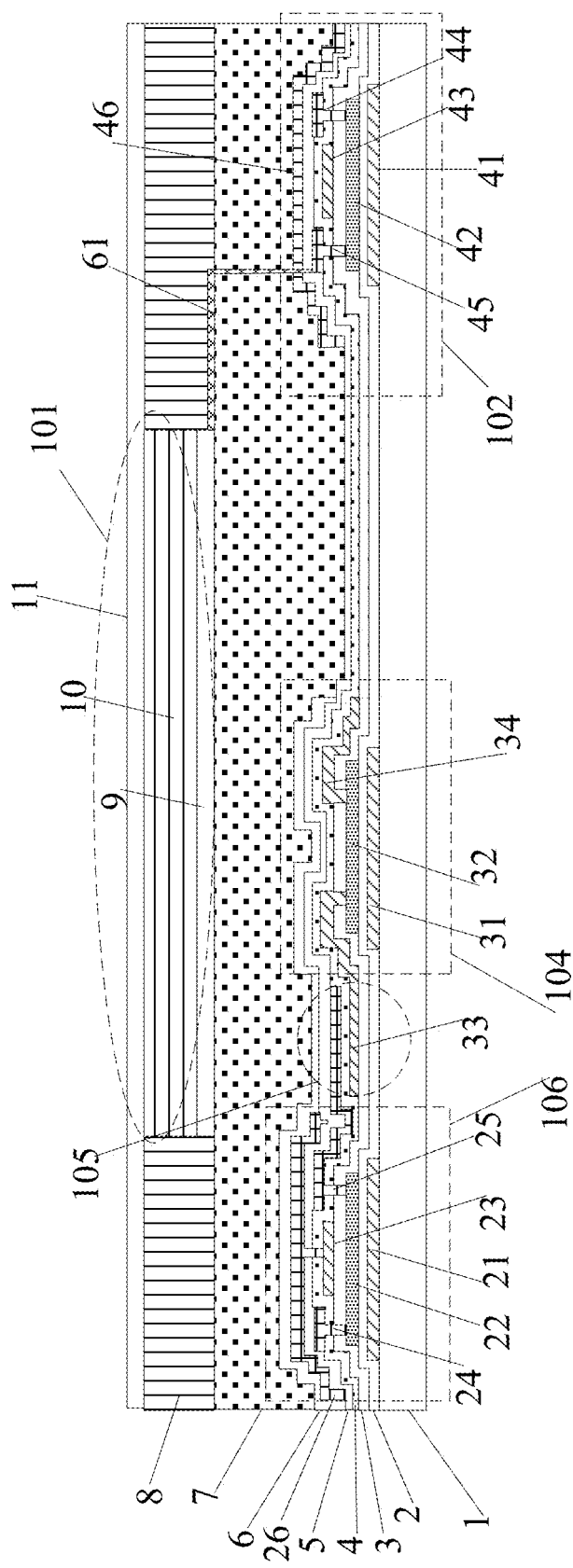
FIG. 2 is a schematic structural view of an OLED display substrate in some embodiments of the present disclosure.

FIG. 2 is a schematic structural view of an OLED display substrate in some embodiments of the present disclosure. As shown in FIG. 2, the OLED display substrate includes the switching thin film transistor 106, the photosensitive thin film transistor 104 and the driving thin film transistor 102 on the base substrate 1. The switching thin film transistor 106 includes a third light-shielding pattern 21, an active layer 22, a gate electrode 23, a drain electrode 24, a source electrode 25 and a fourth light-shielding pattern 26. The photosensitive thin film transistor 104 includes a gate electrode 31, an active layer 32, a drain electrode 33 and source electrode 34. The driving thin film transistor 102 includes a first light-shielding pattern 41, an active layer 42, a gate electrode 43, a source electrode 44, a drain electrode 45 and a second light-shielding pattern 46. The third light-shielding pattern 21, the gate electrode 31 and the first light-shielding pattern 41 are disposed at a same layer and made of a same material, and may be formed in a same patterning process. The active layer 22, the active layer 32 and the active layer 42 are disposed at a same layer and made of a same material, and may be formed in a same patterning process. The gate electrode 23, the drain electrode 33, the source electrode 34 and the gate electrode 43 are disposed at a same layer and made of a same material, and may be formed in a same patterning process. The drain electrode 33, the source electrode 25, and a second insulation layer 4 between the drain electrode 33 and the source electrode 25 form the storage capacitor 105.

Figure 3:
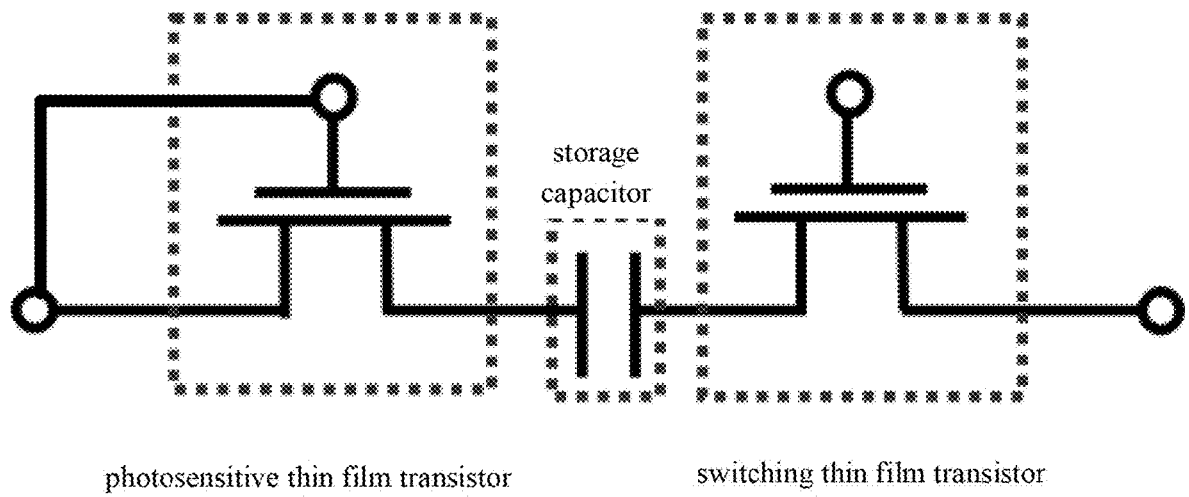
FIG. 3 is a schematic view of disposing a storage capacitor between a photosensitive thin film transistor and a switching thin film transistor in some embodiments of the present disclosure.
Figure 4:
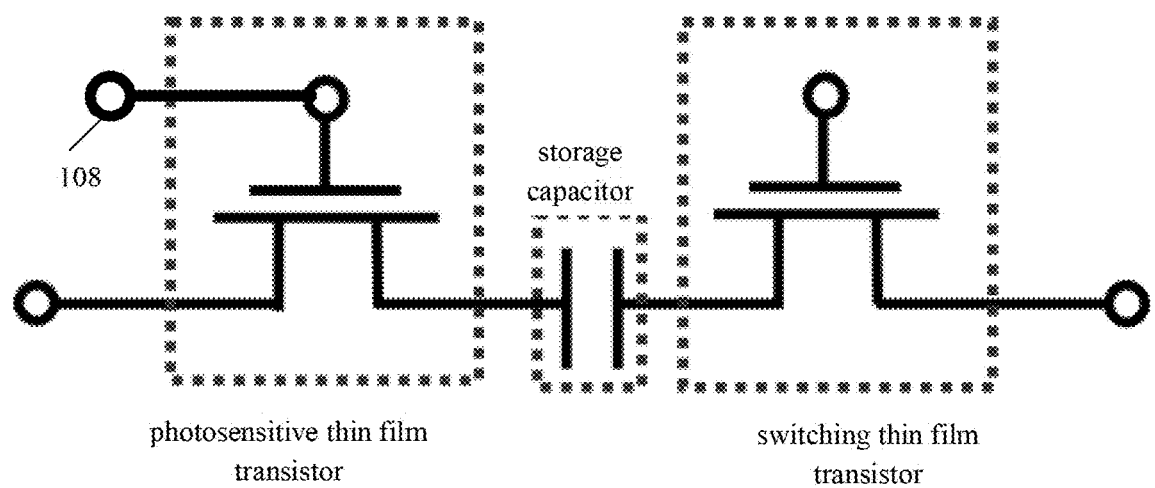
FIG. 4 is a schematic view of a manner for disposing a photosensitive thin film transistor in some embodiments of the present disclosure.
Figure 5:
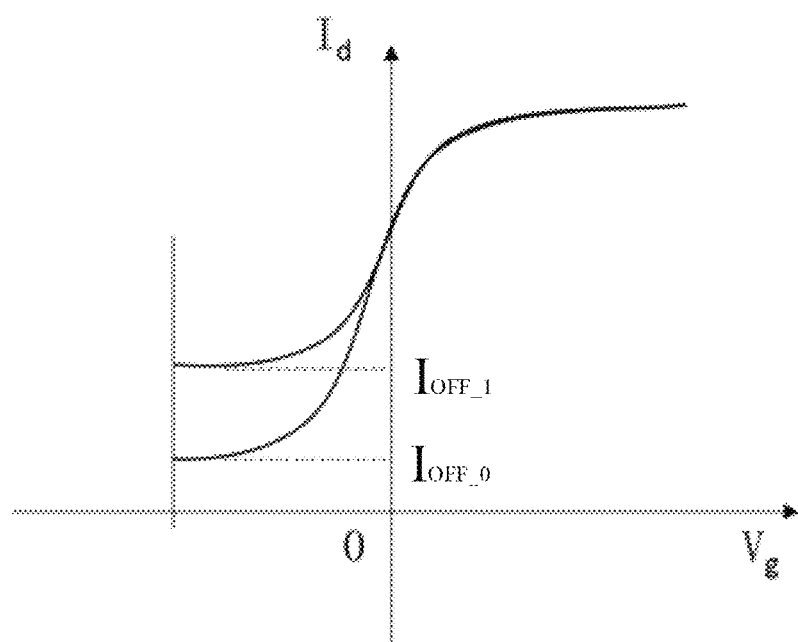
FIG. 5 is a schematic diagram of reading a current output by a photosensitive thin film transistor in some embodiments of the present disclosure.

FIG. 3 is a schematic view of disposing a storage capacitor between a photosensitive thin film transistor and a switching thin film transistor in some embodiments of the present disclosure. FIG. 4 is a schematic view of a manner for disposing a photosensitive thin film transistor in some embodiments of the present disclosure. In FIG. 3, the gate electrode 31 of the photosensitive thin film transistor 104 may be connected to the source electrode 34 of the photosensitive thin film transistor 104. In the case that the OLED light-emitting unit 101 emits light, the photosensitive thin film transistor 104 generates an electrical signal after receiving the light. The electrical signal enables that the gate electrode 31 is turned on. The generated electrical signal flows via the source electrode 34 to the drain electrode 33 of the photosensitive thin film transistor. Then the electrical signal may be fed back to the driving circuit 103 of the OLED display product to realize corresponding optical compensation. In FIG. 4, the gate electrode 31 of the photosensitive thin film transistor 104 is connected to a gate electrode on-state voltage input terminal 108, and a gate electrode on-state voltage is continuously input via the gate electrode on-state voltage input terminal 108. The photosensitive thin-film transistor 104 is continuously turned on, in the case that there is no light irradiated to the photosensitive thin film transistor 104, a leakage current of the photosensitive thin film transistor 104 is a first value, in the case that there is light irradiated to the photosensitive thin film transistor 104, the leakage current of the photosensitive thin film transistor 104 becomes a second value. And the first value and the second value are fed back to the driving circuit 103 of the OLED display product, and the corresponding optical compensation may be realized FIG. 5 is a schematic diagram of reading a current output by a photosensitive thin film transistor in some embodiments of the present disclosure. Taking that the active layer of the photosensitive thin film transistor is an N-type semiconductor as an example, in the case that there is no light irradiated to the photosensitive thin film transistor, the photosensitive thin film transistor is turned on, and $I_{off}$ (the leakage current) at this time is $T_{off\text{-}0}$. In the case that the photosensitive thin film transistor is irradiated by the light emitted by the OLED light-emitting unit, the leakage current of the photosensitive thin film transistor changes. At this time, a new $T_{off}$ is read and recorded as $I_{off\text{-}1}$. Data analysis is performed according to $T_{off\text{-}0}$ corresponding to there is the light and $I_{off\text{-}1}$ corresponding to there is no light, thus the compensation of the OLED light-emitting unit light emission may be realized.

Since all the photosensitive thin film transistor, the switching thin film transistor and the driving thin film transistor are thin film transistors, many film layers of a same layer may be formed in a same patterning process. Taking the OLED display substrate shown in FIG. 2 as an example, a method of forming an OLED display substrate in some embodiments of the present disclosure specifically includes the following steps.

Step S1: providing a base substrate, where the base substrate 1 may be a quartz substrate or a glass substrate.

Step S2: forming a metal layer on the base substrate 1, and patterning the metal layer to form the third light-shielding pattern 21 of the switching thin film transistor 106, the gate electrode 31 of the photosensitive thin film transistor and the first light-shielding pattern 41 of the driving thin film transistor 102. The third light-shielding pattern 21 can prevent external light from being irradiated onto the active layer 22 of the switching thin film transistor 106, which affects the performance of the switching thin film transistor. The first light-shielding pattern 41 can prevent external light from being irradiated onto the active layer 42 of the driving thin film transistor 102, which affects the performance of the driving thin film transistor 102.

Step S3: forming a buffer layer 2. The buffer layer 2 may be selected from an oxide, a nitride and an oxynitride, and a corresponding reaction gas is SiH4, NH3, N2, or SiH2Cl2, NH3, N2.

Step S4: forming a layer of semiconductor material on the buffer layer 2, and patterning the semiconductor material to form the active layer 22 of the switching thin film transistor 106, the active layer 32 of the photosensitive thin film transistor 104 and the active layer 42 of the driving thin film transistor 102.

Step S5: forming a first insulation layer 3. The first insulation layer 3 may be selected from an oxide, a nitride and an oxynitride, and a corresponding reaction gas is SiH4, NH3, N2, or SiH2Cl2, NH3, N2.

Step S6: forming a metal layer on the first insulation layer 3, and patterning the metal layer to form the gate electrode 23 of the switching thin film transistor 106, the drain electrode 33 of the photosensitive thin film transistor 104, the source electrode 34 of the photosensitive thin film transistor 104 and the gate electrode 43 of the driving thin film transistor 102.

Step S7: forming a second insulation layer 4. The second insulation layer 4 may be selected from an oxide, a nitride and an oxynitride, and a corresponding reaction gas is SiH4, NH3, N2, or SiH2Cl2, NH3, N2.

Step S8: forming a metal layer on the second insulation layer 4, and patterning the metal layer to form the source electrode 25 and the drain electrode 24 of the switching thin film transistor 106 and the source electrode 44 and the drain electrode 45 of the driving thin film transistor 102. The source electrode 25 and drain electrode 24 are connected to the active layer 22 through first and second via-holes, respectively, and the source electrode 44 and the drain electrode 45 are connected to the active layer 42 through third and fourth via-holes, respectively.

Step S9: forming a third insulation layer 5. The third insulation layer 5 may be selected from an oxide, a nitride and an oxynitride, and a corresponding reaction gas is SiH4, NH3, N2, or SiH2Cl2, NH3, N2.

Step S10: forming a metal layer on the third insulation layer 5, and patterning the metal layer to form a fourth light-shielding pattern 26 of the switching thin film transistor 106 and a second light-shielding pattern 46 of the driving thin film transistor 102. The fourth light-shielding pattern 26 can shield the active layer 22 to prevent the light emitted by the OLED light-emitting unit 101 from being irradiated onto the active layer 22, which affects the performance of the switching thin film transistor 106. The second light-shielding pattern 46 can shield the active layer 42 of the driving thin film transistor 102 to prevent the light emitted by the OLED light-emitting unit 101 from being irradiated onto the active layer 42 of the driving thin film transistor 102, which affects the performance of the driving thin film transistor 102. In addition, the fourth light-shielding pattern 26 is connected to the gate electrode 23 through a fifth via-hole, which can reduce the influence of parasitic capacitance on the OLED display substrate.

Step S11: forming a fourth insulation layer 6. The fourth insulation layer 6 may be selected from an oxide, a nitride and an oxynitride, and a corresponding reaction gas is SiH4, NH3, N2, or SiH2Cl2, NH3, N2.

Step S12: forming a planarization layer 7. The planarization layer 7 may be made of organic resin.

Step S13: forming an anode 9 of the OLED light-emitting unit. Specifically, a transparent conductive layer may be formed on the planarization layer 7, and patterning is performed on the transparent conductive layer to form the anode 9.

Step S14: forming a pixel definition layer 8. Specifically, a layer of pixel definition layer material may be formed on the planarization layer 7, and patterning is performed on the layer of pixel definition layer material to form the pixel definition layer 8.

Step S15: forming a light-emitting layer 10 of the OLED light-emitting unit. Specifically, a light-emitting material may be evaporated in a pixel area defined by the pixel definition layer 8 to form the light-emitting layer 10.

Then a whole layer of a cathode 11 may be formed on the base substrate went through steps S1 to S15. The anode 9, the cathode 11, and the light-emitting layer 10 between the anode 9 and the cathode 11 constitute the OLED light-emitting unit 101.

Optionally, subsequent to step S13 and prior to step S14, the method of forming the OLED display substrate may further include: forming a sixth via-hole on the planarization layer 7; and forming a conductive line 61 connecting electrically the anode 9 and the drain electrode 45 of the driving thin film transistor 102 through the sixth via-hole.

According to some embodiments of the present disclosure, the photosensitive thin film transistor is used to detect the light emitted by the OLED light-emitting unit and generate the electrical signal, and then optical compensation for the OLED light-emitting unit is achieved. At least one of the film layers of the photosensitive thin film transistor and at least one of the film layers of the driving thin film transistor are disposed at a same layer and made of a same material, and all the film layers of the photosensitive thin film transistor and at least one of the film layers of the driving thin film transistor may be formed in the same patterning process, thereby reducing the number of patterning processes of the OLED display substrate, simplifying the complexity of the OLED display substrate forming process, and reducing the production cost of OLED display substrates.

The following beneficial effects may be achieved in the embodiments of the present disclosure.

According to the above embodiments, the photosensitive thin film transistor is used to detect the light emitted by the OLED light-emitting unit and generate the electrical signal, and then optical compensation for the OLED light-emitting unit is achieved. At least one of the film layers of the photosensitive thin film transistor and at least one of the film layers of the driving thin film transistor may be formed in the same patterning process, thereby reducing the number of patterning processes of the OLED display substrate, simplifying the complexity of the OLED display substrate forming process, and reducing the production cost of OLED display substrates.

In the method embodiments of the present disclosure, the sequence numbers of the steps cannot be used to define the sequence of the steps. For those of ordinary skill in the art, without any creative effort, the sequence of the steps may be changed, which also fall within the scope of the present disclosure.

Unless defined otherwise, technical or scientific terms in the present disclosure shall be of general meanings understood by those with ordinary skills in the art. Terms "first", "second" and similar terms in the embodiments of the present disclosure do not indicate any order, quantity or importance, but are used only for distinguishing different components. A term "include", "comprise" or other term with similar meaning indicates that components or objects before the term cover components, objects or other equivalents listed after the term, instead of excluding other components or objects. A term "connect", "attach" or other term with similar meaning is not limited to a physical connection or a mechanical connection, but may include an electrical connection, whether direct or indirect. "Up", "down", "left", "right" and so on are only used to represent a relative position relationship. When an absolute position of an object is changed, the relative position relationship may also change accordingly.

It should be appreciated that, when a component such as a layer, film, region or substrate is said to be located "above" or "below" another component, the component may be "directly" located "above" or "below" another component, or intermediate components may exist.

The above are merely embodiments of the present disclosure, it should be appreciated that those of ordinary skill in the art may make further modifications and improvements without departing from the principle of the present disclosure, and these modifications and improvements shall also fall within the scope of the present disclosure.

What is claimed is:

1. An Organic Light-emitting Diode (OLED) display substrate, comprising:
    a driving thin film transistor located on a base substrate and configured to drive an OLED light-emitting unit to emit light;
    a photosensitive thin film transistor located on the base substrate and configured to be capable of detecting light emitted by the OLED light-emitting unit and generating an electrical signal, wherein at least a part of film layers of the photosensitive thin film transistor and at least a part of film layers of the driving thin film transistor are disposed at a same layer and made of a same material; and
    a second light-shielding pattern located at a side of an active layer of the driving thin film transistor away from the base substrate,
    wherein a gate electrode of the photosensitive thin film transistor and a first light-shielding pattern of the driving thin film transistor are disposed at a same layer and made of a same material, and the first light-shielding pattern is between an active layer of the driving thin film transistor and the base substrate, and
    wherein an orthographic projection of the active layer of the driving thin film transistor onto the base substrate is within an area of orthographic projections of the first light-shielding pattern and the second light-shielding pattern onto the base substrate, and the orthographic projection of the first light-shielding pattern onto the base substrate is within the orthographic projection of the second light-shielding pattern onto the base substrate.

2. The OLED display substrate according to claim 1, wherein
    an active layer of the photosensitive thin film transistor and the active layer of the driving thin film transistor are disposed at a same layer and made of a same material;
    a source electrode and a drain electrode of the photosensitive thin film transistor and a gate electrode of the driving thin film transistor are disposed at a same layer and made of a same material.

3. The OLED display substrate according to claim 1, further comprising:
    a detection signal line, configured to transmit the electric signal generated by the photosensitive thin film transistor to a driving circuit; and
    a switching thin film transistor, configured to control a conduction connection between an output terminal of the photosensitive thin film transistor and the detection signal line, wherein at least a part of film layers of the switching thin film transistor and at least a part of film layers of the driving thin film transistor are disposed at a same layer and made of a same material.

4. The OLED display substrate according to claim 3, wherein a third light-shielding pattern of the switching thin film transistor and a first light-shielding pattern of the driving thin film transistor are disposed at a same layer and made of a same material, the first light-shielding pattern is located between an active layer of the driving thin film transistor and the base substrate, and the third light-shielding pattern is located between an active layer of the switching thin film transistor and the base substrate;
    the active layer of the switching thin film transistor and the active layer of the driving thin film transistor are disposed at a same layer and made of a same material;
    a source electrode and a drain electrode of the switching thin film transistor and a source electrode and a drain electrode of the driving thin film transistor are disposed at a same layer and made of a same material.

5. The OLED display substrate according to claim 4, further comprising:
    a fourth light-shielding pattern located at a side of the active layer of the switching thin film transistor away from the base substrate, wherein an orthographic projection of the active layer of the switching thin film transistor onto the base substrate is within an orthographic projection of the fourth light-shielding pattern onto the base substrate.

6. The OLED display substrate according to claim 5, wherein the fourth light-shielding pattern is connected to a gate electrode of the switching thin film transistor through a via-hole.

7. The OLED display substrate according to claim 3, wherein
    a drain electrode of the switching thin film transistor is connected to the detection signal line, and a source electrode of the switching thin film transistor is connected to the output terminal of the photosensitive thin film transistor, or the drain electrode of the switching thin film transistor is connected to the detection signal line, and a storage capacitor is formed between the source electrode of the switching thin film transistor and the output terminal of the photosensitive thin film transistor; and
    the output terminal of the photosensitive thin film transistor is a source electrode or a drain electrode of the photosensitive thin film transistor.

8. The OLED display substrate according to claim 3, wherein the photosensitive thin film transistor, the driving thin film transistor and the switching thin film transistor are located between the OLED light-emitting unit and the base substrate.

9. The OLED display substrate according to claim 1, wherein a gate electrode of the photosensitive thin film transistor is connected to a source electrode of the photosensitive thin film transistor.

10. A display device comprising the OLED display substrate according to claim 1.

11. The OLED display substrate according to claim 1, wherein the gate electrode of the photosensitive thin film transistor is connected to a gate electrode on-state voltage input terminal, and the gate electrode on-state voltage input terminal is configured to input a gate electrode on-state voltage.

12. A method of forming an organic light-emitting diode (OLED) display substrate, comprising:
forming at least a part or all of film layers of a photosensitive thin film transistor and at least a part or all of film layers of a driving thin film transistor on a base substrate in a same patterning process simultaneously, and
forming a second light-shielding pattern located at a side of an active layer of the driving thin film transistor away from the base substrate;
wherein the photosensitive thin film transistor is capable of detecting light emitted by an OLED light-emitting unit and generating an electrical signal, and the driving thin film transistor is configured to drive the OLED light-emitting unit to emit light,
wherein a gate electrode of the photosensitive thin film transistor and a first light-shielding pattern of the driving thin film transistor are disposed at a same layer and made of a same material, and the first light-shielding pattern is between an active layer of the driving thin film transistor and the base substrate, and
wherein an orthographic projection of the active layer of the driving thin film transistor onto the base substrate is within an area of orthographic projections of the first light-shielding pattern and the second light-shielding pattern onto the base substrate, and the orthographic projection of the first light-shielding pattern onto the base substrate is within the orthographic projection of the second light-shielding pattern onto the base substrate.

13. The method of forming the OLED display substrate according to claim 12, wherein the forming at least a part or all of the film layers of the photosensitive thin film transistor and at least a part or all of the film layers of the driving thin film transistor on the base substrate in the same patterning process comprises:
forming a gate electrode of the photosensitive thin film transistor and a first light-shielding pattern of the driving thin film transistor simultaneously in one patterning process, wherein the first light-shielding pattern is located between an active layer of the driving thin film transistor and the base substrate;
forming an active layer of the photosensitive thin film transistor and the active layer of the driving thin film transistor simultaneously in one patterning process;
forming a source electrode of the photosensitive thin film transistor, a drain electrode of the photosensitive thin film transistor and a gate electrode of the driving thin film transistor simultaneously in one patterning process.

14. The method of forming the OLED display substrate according to claim 13, wherein subsequent to the forming the source electrode and the drain electrode of the photosensitive thin film transistor, the method further comprises:
connecting the gate electrode of the photosensitive thin film transistor to the source electrode of the photosensitive thin film transistor; or
subsequent to the forming the gate electrode of the photosensitive thin film transistor, the method further comprises: connecting the gate electrode of the photosensitive thin film transistor to a gate electrode on-state voltage input terminal.

15. The method of forming the OLED display substrate according to claim 12, further comprising:
forming a detection signal line configured to transmit the electric signal generated by the photosensitive thin film transistor to a driving circuit; and
forming a switching thin film transistor configured to control a conduction connection between an output terminal of the photosensitive thin film transistor and the detection signal line, wherein at least a part of film layers of the switching thin film transistor and at least a part of film layers of the driving thin film transistor are formed in a same patterning process.

16. The method of forming the OLED display substrate according to claim 15, wherein the forming the switching thin film transistor comprises:
forming a third light-shielding pattern of the switching thin film transistor and a first light-shielding pattern of the driving thin film transistor simultaneously in one patterning process, wherein the first light-shielding pattern is located between an active layer of the driving thin-film transistor and the base substrate, the third light-shielding pattern is located between an active layer of the switching thin film transistor and the base substrate;
forming the active layer of the switching thin film transistor and the active layer of the driving thin film transistor simultaneously in one patterning process,
forming a source electrode and a drain electrode of the switching thin film transistor and a source electrode and a drain electrode of the driving thin film transistor simultaneously in one patterning process.

17. The method of forming the OLED display substrate according to claim 12, further comprising:
forming a fourth light-shielding pattern located at a side of an active layer of the switching thin film transistor away from the base substrate.

18. The method of forming the OLED display substrate according to claim 12, further comprising:
forming the OLED light-emitting unit on the base substrate on which the photosensitive thin film transistor, the driving thin film transistor and a switching thin film transistor are formed.

* * * * *